(12) United States Patent
Geng et al.

(10) Patent No.: US 7,531,102 B2
(45) Date of Patent: May 12, 2009

(54) SIMULTANEOUS SELECTIVE POLYMER DEPOSITION AND ETCH PITCH DOUBLING FOR SUB 50NM LINE/SPACE PATTERNING

(75) Inventors: Qiquan Geng, San Jose, CA (US); Jeff J Xu, San Jose, CA (US); Everett B Lee, Los Altos, CA (US); Michael T Ru, Santa Clara, CA (US); Hsu-en Yang, San Jose, CA (US); Chung Hui, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 432 days.

(21) Appl. No.: 11/395,626

(22) Filed: Mar. 31, 2006

(65) Prior Publication Data

US 2007/0228002 A1 Oct. 4, 2007

(51) Int. Cl.
B44C 1/22 (2006.01)

(52) U.S. Cl. .............................. 216/37; 216/58; 216/67; 216/71; 216/77; 438/637; 438/689; 438/692

(58) Field of Classification Search ................ 438/637; 216/37; 427/569
See application file for complete search history.

(56) References Cited

U.S. PATENT DOCUMENTS

2006/0154477 A1* 7/2006 Geng et al. ................. 438/637

* cited by examiner

*Primary Examiner*—Nadine Norton
*Assistant Examiner*—Maki Angadi
(74) *Attorney, Agent, or Firm*—Blakely, Sokoloff, Taylor & Zafman LLP

(57) ABSTRACT

First radicals and second radicals are simultaneous deposited into a space defined by two adjacent lines of photoresists and an underlying layer. A portion of the first radicals and the second radicals combine to form a polymer layer on the layer in the center of the space, and substantially simultaneously, another portion of thee first radicals remove the underlying layer near the base of the photoresists. The first radicals may be fluorine-rich and the second radicals may be carbon-rich.

20 Claims, 4 Drawing Sheets

SIMULTANEOUS SELECTIVE POLYMER DEPOSITION AND ETCH PITCH DOUBLING FOR SUB 50NM LINE/SPACE PATTERNING

BACKGROUND

1. Field

Semiconductor fabrication.

2. Description of Related Art

Photolithography is a technique for transferring an image rendered on one media onto another media photographically. Photolithography techniques are widely used in semiconductor fabrication. Typically, a circuit pattern is rendered as a positive or negative mask image which is then projected onto a silicon substrate coated with photosensitive materials. Radiation impinges on the masked surface to chemically change those areas of the coating exposed to the radiation, usually by polymerizing the exposed coating. The unpolymerized areas are removed, being more soluble in the developer than the polymerized regions, and the desired image pattern remains.

As circuits continue to miniaturize in scale, chip manufacturers have started using radiation with wavelengths shorter than the visible light. Typically, optical lithography systems use radiation at wavelengths such as 365 nanometers (nm), 248 nm, 193 nm, and 157 nm. Advanced non-optical lithography systems with shorter wavelengths such as extreme ultraviolet (EUV) are being actively researched for printing complex patterns in the extreme submicron range. However, the problem of diffraction-limited optics remains with these technologies.

Another recent technique developed by chip manufacturers to increase the resolution and contrast of optical lithography involves the use of immersion technology. Immersion lithography is a resolution enhancement technique that interposes a liquid medium between optical components and the wafer surface, replacing the usual air gap. This liquid medium has a refractive index greater than one. With the 193 nm wavelength, a typical liquid medium is ultra-pure, degassed water. Although the immersion technology may enable the reduction of circuit feature size, upgrade to an immersion lithography system is very costly. Moreover, many defect issues induced by the immersion technology are still lacking a feasible solution.

BRIEF DESCRIPTION OF THE DRAWINGS

Embodiments are illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

Figure 1:
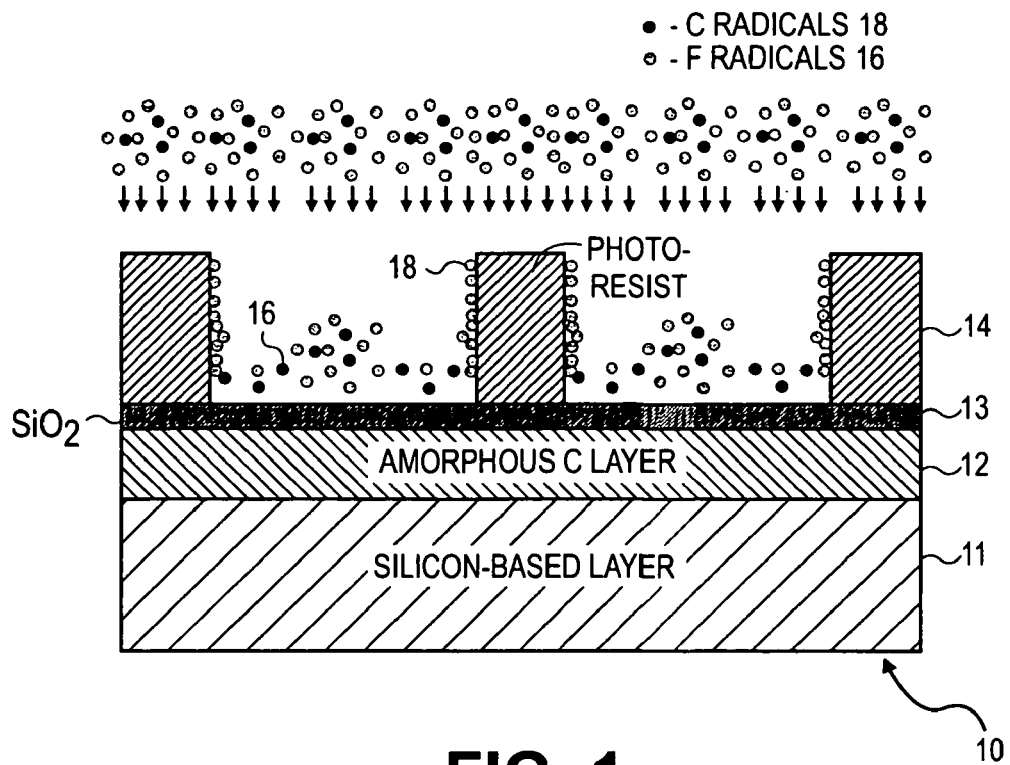
FIG. 1 illustrates an embodiment of a pitch-doubling technique in which carbon-rich radicals and fluorine-rich radicals are substantially simultaneously deposited into a resist space defined by adjacent photoresists and an underlying second mask layer.

FIG. 1 shows an embodiment of a semiconductor structure 10 including a plurality of photoresists 14 (or equivalently, resists) on an underlying second hard mask layer 13 (e.g., $SiO_2$, SIOH, or SiON). Underneath second hard mask layer 13 are a first hard mask layer 12 (e.g., amorphous carbon), and a silicon-based layer 11 (e.g., $SiO_2$, SiOH, SiON, $Si_3N_4$, or Si). In the embodiment as shown, $SiO_2$ is used as second hard mask 13 and amorphous C is used as first hard mask layer 12. Although specific materials are disclosed, it is to be understood that embodiments are not limited to these disclosed materials and may vary according to circuit design requirements.

In a process to be described in greater detail below, line/space patterns will be formed in silicon-based layer 11. Microelectronic circuit components, such as transistors, may be created based on the line/space patterns. Photoresists 14 may be arranged to create a line/space pattern that suits circuit design requirements, except that the "pitch size" of such line/space pattern is twice as large as the required design. The term "pitch" hereinafter refers to a line combined with the adjacent space at either side of the line. In certain embodiments, photoresists 14 may be arranged to form a pattern of nested (i.e., periodic) lines that run parallel to each other. Photoresists 14 may be spaced equally to form equally-spaced lines, or arranged to form equal-width lines. In alternative embodiments, two lines of photoresists 14 may be used to define a single space between them. To minimize the size of a circuit, it is often desired that the size (i.e., width) of a pitch may be reduced. Stated differently, in a given area, it is often desired that the number of pitches may be increased.

The process described below is an embodiment of a pitch-doubling technique that doubles the number of pitches within a given width. The pitch-doubling technique is based on simultaneous polymerization and etching of the surface of semiconductor structure 10. Referring again to FIG. 1, fluorine-rich radicals (F radicals 16) and carbon-rich radicals (C radicals 18) are substantially simultaneously deposited onto semiconductor structure 10. F radicals 16 refer to two or more fluorine or fluorocarbon atoms bound together as a single unit, and C radicals 18 refer to two or more carbon atoms bound together as a single unit. F radicals 16 serve as an "etching agent" for etching away selective areas of $SiO_2$ layer 13. C radicals 18 serve as a "compound-forming agent" for bonding with F radicals 16 and photoresists 14 to form compounds, e.g., polymers. The choice of the etching agent and the compound-forming agent may depend on the underlying layers to be etched. In alternative embodiments where different material layers lie underneath photoresists 14, different chemicals may be used as the etching agent and the compound-forming agent.

The deposition of mixed F radicals 16 and C radicals 18 (mixed F/C gas) may cause polymerization, etching, or a combination of both, on the surface of semiconductor structure 10. The ratio of F radicals 16 to C radicals 18 (F/C ratio) in the mixed F/C gas, as well as a bias voltage applied to the surface of structure 10, determines whether polymerization or etching will occur. The bias voltage and the F/C ratio determine a threshold for the polymerization/etching phenomenon. Generally, polymerization occurs when the F/C ratio is lower than the threshold; etching occurs when the F/C ratio is high than the threshold. Referring back to FIG. 1, the ratio of F radicals 16 to C radicals 18 is chosen to be lower than the threshold on a macro scale (i.e., in the polymerization region) but close to the threshold. The presence of photoresists 14 serves to tilt the balance of the F/C ratio in the mixed gas. As a large quantity of C radicals 18 polymerize on the sidewalls of photoresists 14, on a nano-scale, the F/C ratio in the mixed gas in the localized areas near the photoresists is increased. The F/C ratio may be increased to the point that it crosses the polymerization/etching threshold in these localized areas. Thus, selective etching occurs in the areas near photoresists 14 and polymer deposition occurs in the other surface areas of structure 10. Thus, simultaneous polymer deposition and selective etching may be achieved.

An embodiment of the pitch doubling technique, as will be described in detail below, applies the simultaneous polymerization and etching phenomenon described above. In one embodiment, F radicals 16 and C radicals 18 may be generated in a plasma chamber where radio frequency (RF) power is used to excite and disassociate molecules of carbon-rich gas (e.g., CO) and fluorocarbon-rich gas (CnFm, where n and m are integers). Example of the fluorocarbon-rich gas includes CF4, C2F6, C4F8, C5F8, or C4F6. The gas molecules are dissociated into ions and neutrals (free radicals), which are chemically active atoms and molecules. The RF power may cause a series of chemical reactions to occur. For example, chemical reactions may include fluorocarbon dissociation (CnFm+e→CF2+CF+F+CxFy +e, where x, y are positive integers), CO dissociation (CO+e→C+O+e), CO scavenge effect (CO+2F→COF2), carbon and fluorine recombination (2C+F+F2→CF+CF2).

Figure 2:
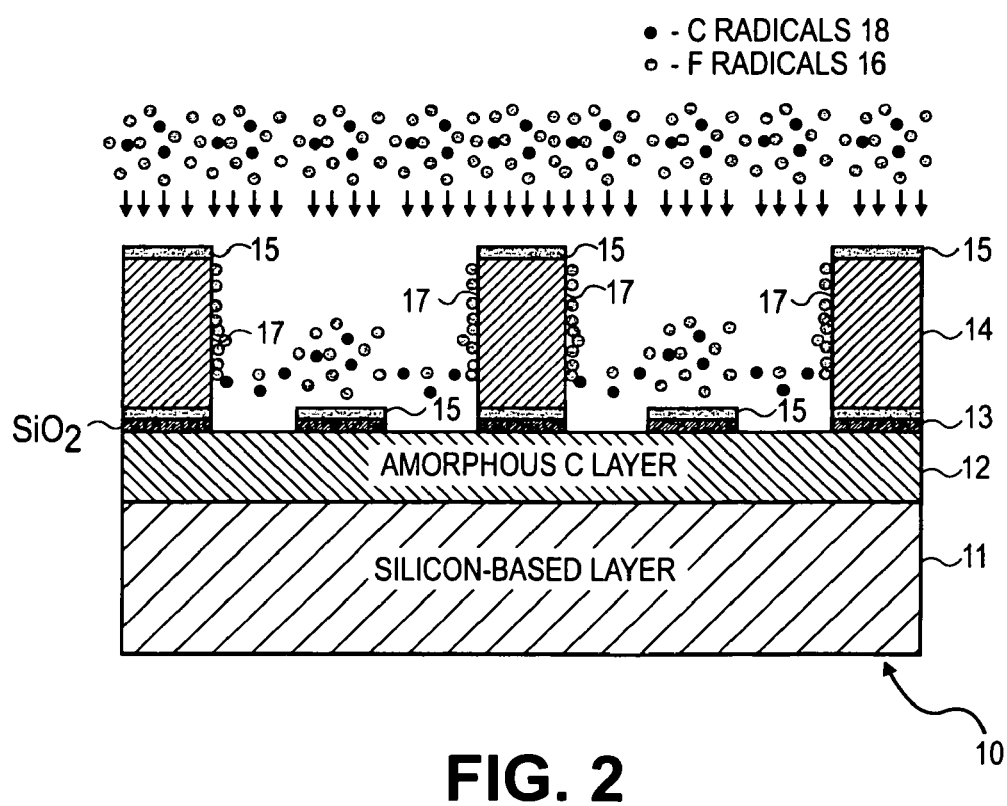
FIG. 2 illustrates a simultaneous process of polymerization and etching as a result of the deposition of the carbon-rich radicals and the fluorine-rich radicals.

In one embodiment, the RF power generates a dominant environment of C radicals 18 with a small percentage of F radicals 16. That is, the injection gases containing C radicals 18 dominate the injection gases containing F radicals 16. The F/C ratio is chosen such that the ratio is in the polymerization region but close to the polymerization/etching threshold. Referring to FIG. 2, when radicals 16 and 18 diffuse down onto semiconductor structure 10, C radicals 18 and F radicals 16 recombine to form a layer of a fluorocarbon (C—F) polymer 15 on top of photoresists 14 and in the center of a resist space 19, defined as the space between adjacent photoresists 14 and above SiO2 layer 13. The C—F polymer layer 15 formed on top of SiO2 layer 13 serves as a protective layer or an etch mask for the SiO2.

In one embodiment, photoresists 14 contain hydrocarbon (e.g., CH3—C—CH3) which is a component of 193 nanometer (nm) photoresists. As carbon reacts with hydrocarbon, a large percentage of C radicals 18 attach to the sidewalls of photoresists 14 to form a hydrocarbon (C—H) polymer 17. This allows the F/C ratio in the localized areas near photoresists 14 to increase above the polymerization/etching threshold. As a result, most of F radicals 16 near the edge of resist space 19 diffuse down along the surface of the resist sidewalls and etch away underlying SiO2 layer 13 that is not covered by C—F polymer 15. Thus, simultaneous polymer deposition and selective etching occur. The dimensions of the etched areas of SiO2 layer 13 can be controlled by tuning etch parameters including, for example, the pressure of the reaction chamber, the concentration of F radicals 16, C radicals 18, as well as their localized ratios, the gradients, the diffusion constants and the mean free path, and the materials and thickness of the underlying layer. These etch parameters may be controlled to create a desired line width and/or a desired space width.

As shown in FIG. 1 and FIG. 2, the process of polymerization and etching occurs substantially simultaneously. C—F polymer 15 is formed in the center of resist space 19 to protect underlying SiO2 layer 13 from being etched by F radicals 16. As C radicals 18 near the edge of resist space 19 are attracted by photoresists 14, the F/C ratio in these localized areas are increased, allowing F radicals 16 in the same areas to diffuse down and etch away underlying SiO2 layer 13. As a result, SiO2 layer 13 is selectively etched to form a line/space pattern with a pitch size half of that originally defined by photoresists 14 in FIG. 1. Remaining SiO2 layer 13 will serve as an etch hard mask for amorphous C 12 in a subsequent etching process.

Figure 3:
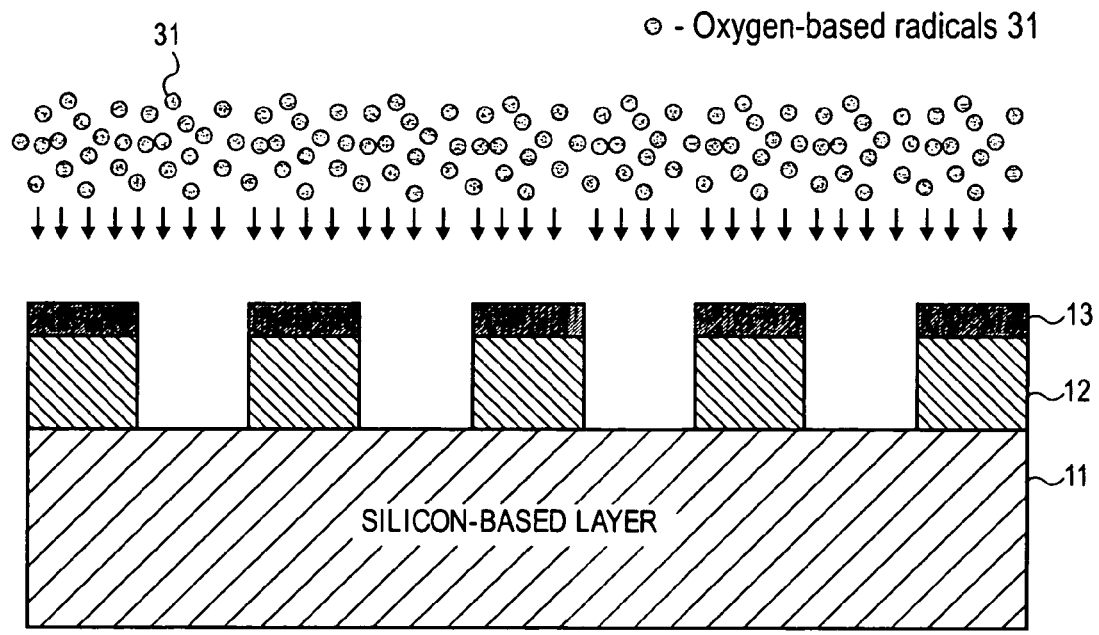
FIG. 3 shows that oxygen-rich radicals are used to etch the photoresists, the polymers, and an underlying first mask layer of amorphous carbon.

Referring to FIG. 3, oxygen-rich radicals 31 (e.g., mixed O2/CO gas or mixed O2/Cl gas) are generated in the etch chamber where semiconductor structure 10 is located. Oxygen-rich radicals 31 serve to etch C—F polymer 15, C—H polymer 17, photoresists 14, and the portion of amorphous C 12 not covered by the second hard mask 13. Thus, the line/space pattern of SiO2 13 in FIG. 2 is replicated onto amorphous C 12. Remaining amorphous C 12 will serve as an etch hardmask for silicon-base layer 11 in a subsequent etching process.

Figure 4:
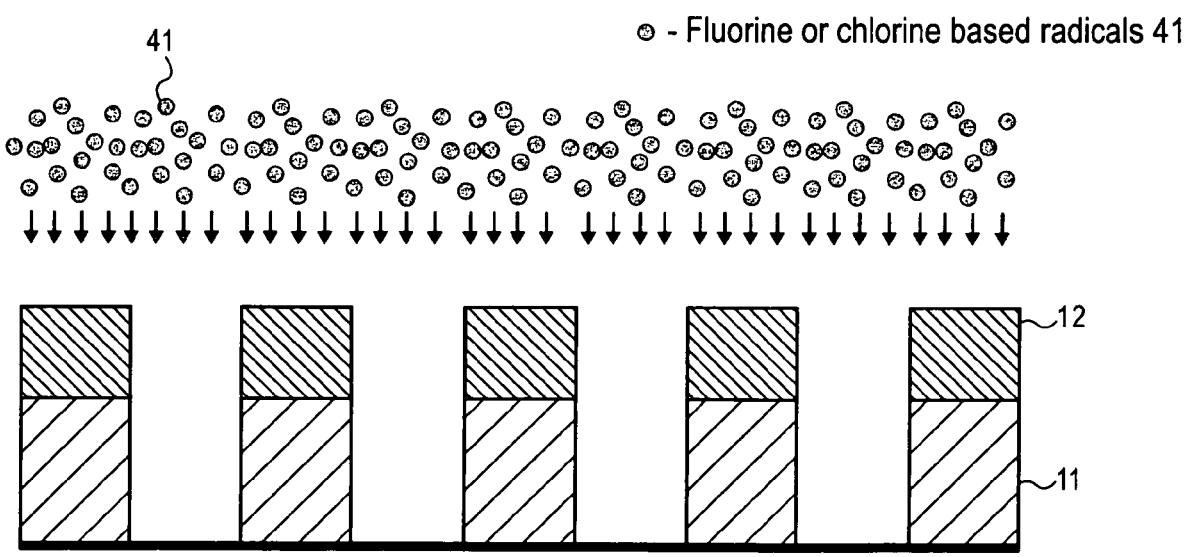
FIG. 4 shows that fluorine-rich or chlorine-rich radicals are used to etch an exposed silicon-based layer to form a line/space pattern.

Referring to FIG. 4, fluorine or chlorine (Cl) rich radicals 41 (e.g., BCl3 or HBr) are generated in the etch chamber. Radicals 41 etch exposed underlying silicon-base layer 11 to form a final structure of an array of line/space structure 42. Depending on the design requirements, the space between adjacent lines may be filled with oxide or metal for isolation or conduction.

Experiments demonstrate that a 105 nm resist space may be divided into to 35 nm trench (space), 35 nm oxide line, and 35 nm trench using the pitch-doubling technique described in FIG. 1-FIG. 4. The 35 nm width falls into the 32 nm technology node design rule which is two generations ahead of the current technology. The pitch-doubling technique described herein, however, is not limited to 35 nm. Within technological limits, the pitch-doubling technique may be applied to a space of any width to create a line within that space. The technique may also be applied to an array of lines/spaces of any width to half the pitch size of that array. The array of lines may be parallel lines, curved lines, or lines with any geometry that may or may not be parallel to each other. The final structure may have equal space and/or equal line width if desired by a circuit design.

Figure 5:
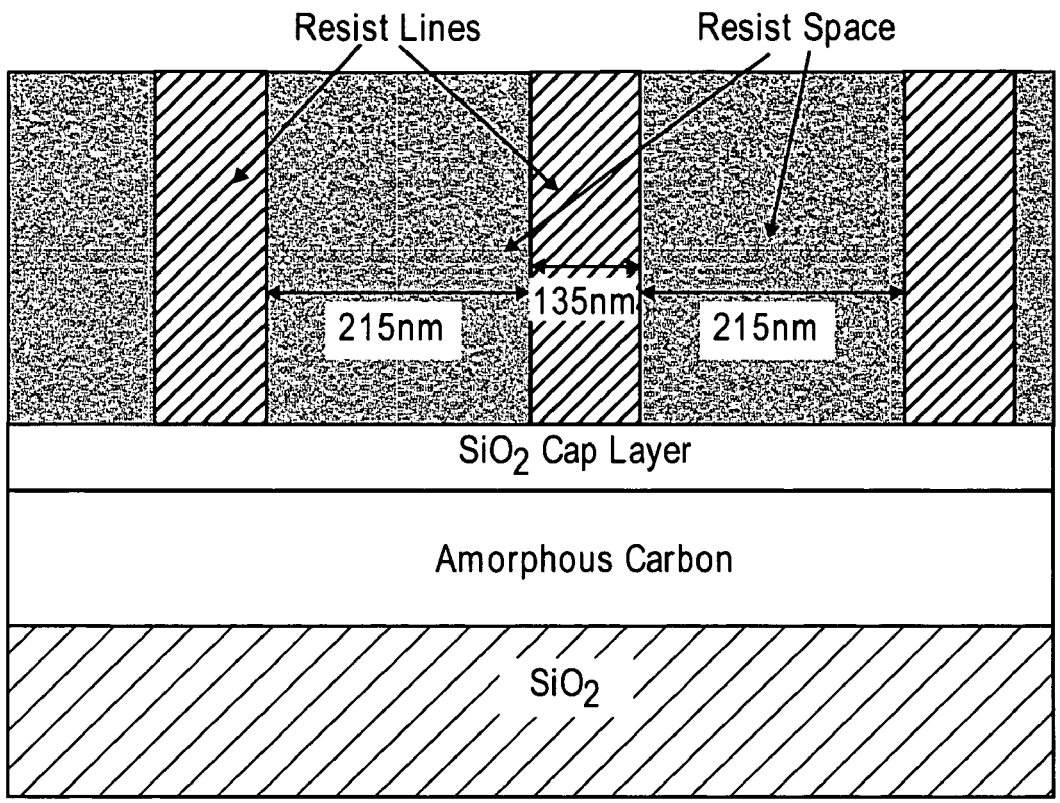
FIG. 5 shows a lithographically printed wafer having 135 nm resist lines spaced by 215 nm resist spaces.
Figure 6:
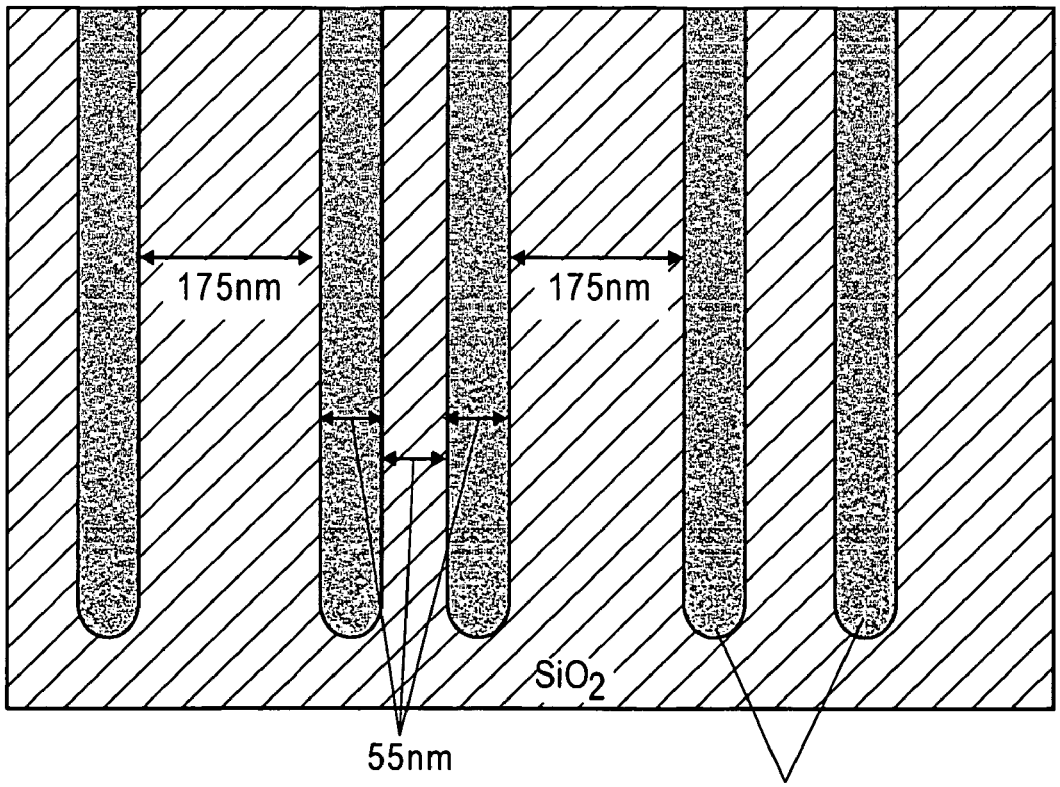
FIG. 6 shows each 215 nm resist space of FIG. 5 is divided into a 55 nm trench, 55 nm line, and a 55 nm trench pattern.

Referring to FIG. 5, a wafer was lithographically printed with 135 nm resist line and 215 nm resist space. Also referring to FIG. 1, the silicon-based dielectric layer at the bottom of the figure may be silicon dioxide (SiO2) having a thickness in the approximate range of 3150 Å and 7150 Å, and more particularly 5150 Å. A first hard mask is formed above the silicon-based layer. The first mask may comprise any material that is not etched by the same etchants that may be used to etch the silicon-based layer. The first hard mask may be amorphous carbon having a thickness in the approximate range of 700 Å and 1800 Å, and more particularly approximately 1300 Å. An amorphous carbon first hard mask may be formed by a spin-on process, CVD (chemical vaporized deposition), PVD (physical vaporized deposition), ALD (automatic layer deposition), or sputtering. In the embodiment as shown, a second hard mask is formed over the first hard mask with a material that is not etched by the same etchants that may be used to etch the first hard mask. The second hard mask may be SiO2, SiON, or SiOH having a thickness in the approximate range of 200 Å and 500 Å. After applying the pitch-doubling technique described in FIG. 1-FIG. 4, in FIG. 6, the 215 nm resist space is divided into 55 nm trench, 55 nm line, and 55 nm trench. The 135 nm resist line, however, was translated to a 175 nm line. This is because hydrocarbon (C—H) polymer was formed on the resist sidewalls with a thickness of 25 nm per side during the process of FIG. 1 and FIG. 2. The hydrocarbon polymer growth on the resist sidewalls may be reduced by CO dissociation (thus reducing C radical concentration) and by generating lithographically printed pattern with smaller resist lines.

Figure 7:
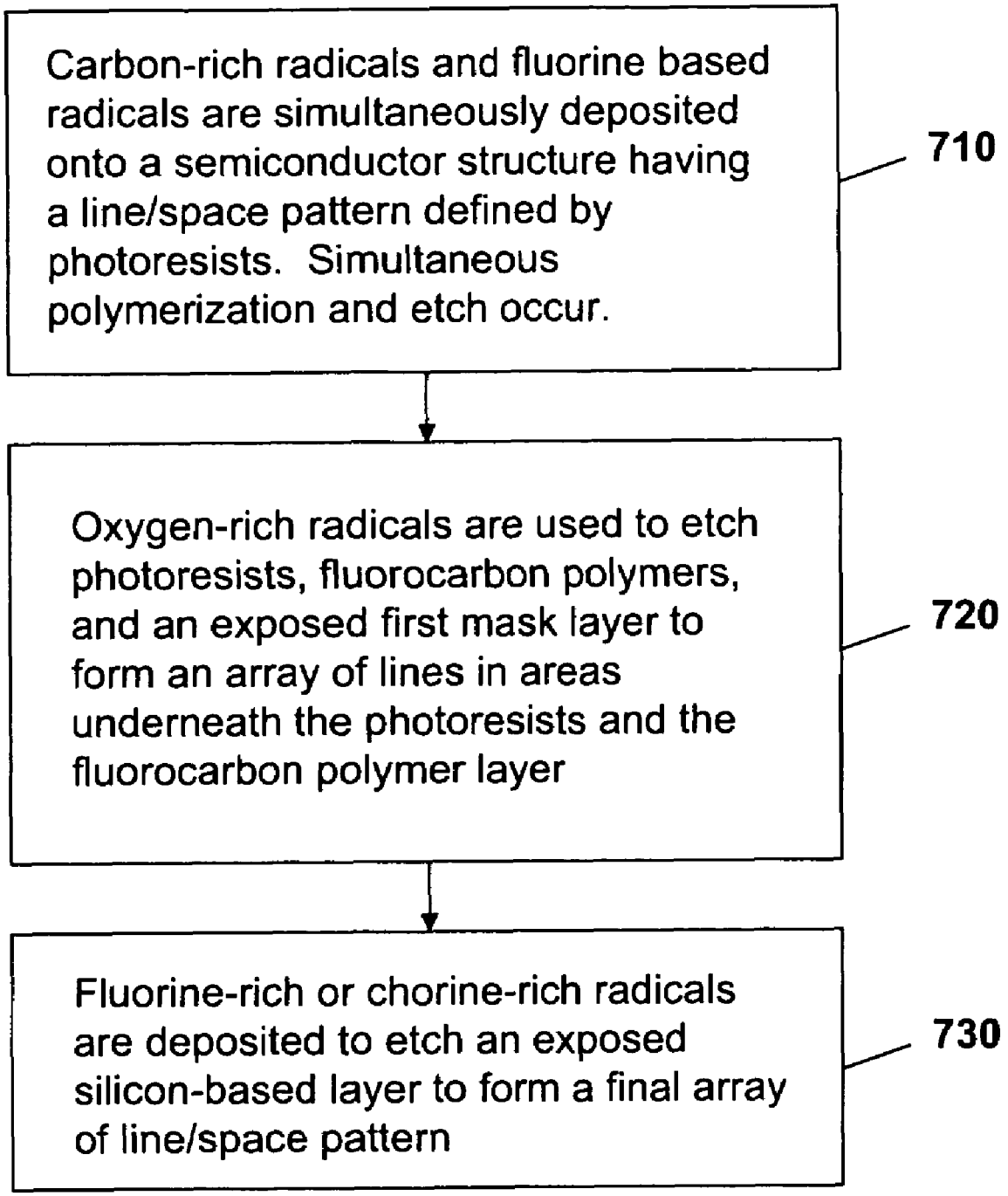
FIG. 7 shows a flowchart of an embodiment of the pitch-doubling technique described in FIGS. 1-4.

FIG. 7 is a flowchart illustrating an embodiment of a pitch-doubling process applied to a semiconductor structure, e.g., semiconductor structure 10 of FIG. 1, which includes a space between two lines of photoresists (e.g., photoresists 14) or a line/space pattern defined by an array of photoresist lines. At block 710, carbon-rich radicals and fluorine-rich radicals are deposited onto the semiconductor structure. Polymerization (including formation of fluorocarbon polymer and hydrocarbon polymer) and etching of an underlying second hard masklayer (e.g., SiO2 13 of FIG. 1) substantially simultaneously occur. The underlying second hard mask layer is etched such that the etched portions are located near the base of the photoresists. At block 720, oxygen-rich radicals are used to etch an exposed first hard mask layer (e.g., amorphous C 12) not covered by the remaining second hard mask layer. The oxygen-rich radicals also etch away the polymers and the photoresists. At block 730, fluorine or chorine-rich radicals are deposited to etch an exposed silicon-based layer (e.g., silicon-based layer 11) not covered by the remaining first mask layer. As a result, a final array of line/space pattern is formed with a pitch size half of that originally defined by the photoresists. The number of pitches in a given width is thus doubled.

In the foregoing specification, specific embodiments have been described. It will, however, be evident that various modifications and changes can be made thereto without departing from the broader spirit and scope of the appended claims. The specification and drawings are, accordingly, to be regarded in an illustrative rather than a restrictive sense

What is claimed is:

1. A method comprising:
substantially simultaneously depositing first radicals and second radicals into a space defined by two lines of photoresists and an underlying layer, wherein a portion of the first radicals and second radicals combine to form a protective layer on a portion of the underlying layer and, substantially simultaneously, another portion of the first radicals remove another portion of the underlying layer.

2. The method of claim 1 wherein depositing first radicals comprises:
depositing fluorine-rich radicals as the first radicals to serve as an etching agent for the underlying layer.

3. The method of claim 1 wherein depositing second radicals comprises:
depositing carbon-rich radicals as the second radicals to serve as a compound-forming agent.

4. The method of claim 1 wherein a portion of the first radicals and second radicals combine to form a protective layer on a portion of the underlying layer comprises:
forming a polymer layer as the protected layer in the center of the space.

5. The method of claim 4 wherein the polymer layer is a fluorocarbon polymer layer.

6. The method of claim 1 wherein another portion of the first radicals remove another portion of the underlying layer comprises:
etching the underlying layer near the base of the photoresists by the first radicals.

7. The method of claim 1 further comprising:
forming a hydrocarbon polymer layer onto the photoresists.

8. The method of claim 1 further comprising:
forming an isolated line in the center of the space, the isolated line having an equal distance from the two lines of photoeresists.

9. A method comprising:
substantially simultaneously depositing first radicals and second radicals onto a plurality of photoresists lines located on an underlying layer to create a plurality of lines in the underlying layer between adjacent two of the photoresists lines.

10. The method of claim 9 wherein a portion of the first radicals and second radicals combine to form a protective layer on a portion of the underlying layer and, substantially simultaneously, another portion of the first radicals remove another portion of the underlying layer.

11. The method of claim 9 wherein depositing the first radicals comprises:
depositing fluorine-rich radicals as the first radicals to serve as an etching agent for the underlying layer.

12. The method of claim 9 wherein depositing the second radicals comprises:
depositing carbon-rich radicals as the second radicals to serve as a compound-forming agent.

13. The method of claim 9 further comprising:
forming a fluorocarbon polymer layer as a mask to protect the plurality of lines in the underlying layer from being etched by the first radicals.

14. The method of claim 13 further comprising:
depositing oxygen-rich radicals to remove the photoresists, the fluorocarbon polymer layer, and portions of an amorphous carbon layer to form an array of lines in areas originally underneath the photoresists and the fluorocarbon polymer layer.

15. The method of claim 14 further comprising:
depositing fluorine-rich or chorine-rich radicals to etch a silicon-based layer to form the array of lines in the silicon-based layer.

16. The method of claim 9 further comprising:
forming substantially equally-spaced lines in layers underneath the underlying layer.

17. The method of claim 9 further comprising:
forming substantially equally-width lines in layers underneath the underlying layer.

18. A method comprising:
depositing a polymer pattern on an underlying layer in the presence of photoresists that lie the underlying layer; and substantially simultaneously, removing a portion of the underlying layer.

19. The method of claim 18 wherein removing a portion of the underlying layer comprises:
removing the portion of the underlying layer exposed from the polymer pattern and the photoresists.

20. The method of claim 18 further comprising:
depositing fluorine-rich radicals and carbon-rich radicals to form the polymer pattern and to remove the portion of the underlying layer substantially simultaneously.

* * * * *